US012040596B2

(12) United States Patent
Nakamura et al.

(10) Patent No.: US 12,040,596 B2
(45) Date of Patent: Jul. 16, 2024

(54) OPTICAL SEMICONDUCTOR DEVICE, OPTICAL SUBASSEMBLY, AND OPTICAL MODULE

(71) Applicant: Lumentum Japan, Inc., Kanagawa (JP)

(72) Inventors: Atsushi Nakamura, Nagano (JP); Akira Nakanishi, Tokyo (JP); Shunya Yamauchi, Kanagawa (JP); Hayato Takita, Kanagawa (JP); Yoshihiro Nakai, Kanagawa (JP); Hideaki Asakura, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 457 days.

(21) Appl. No.: 16/834,808

(22) Filed: Mar. 30, 2020

(65) Prior Publication Data

US 2020/0328575 A1 Oct. 15, 2020

(30) Foreign Application Priority Data

Apr. 12, 2019 (JP) ................................ 2019-076530

(51) Int. Cl.
*H01S 5/026* (2006.01)
*H01S 5/028* (2006.01)
(Continued)

(52) U.S. Cl.
CPC .............. *H01S 5/227* (2013.01); *H01S 5/026* (2013.01); *H01S 5/04256* (2019.08); *H01S 5/12* (2013.01);
(Continued)

(58) Field of Classification Search
CPC ......... H01S 5/227–2277; H01S 5/4025; H01S 5/4031; H01S 5/4056–4075; H01S 5/12–1246; H01S 5/04256–04257
See application file for complete search history.

(56) References Cited

U.S. PATENT DOCUMENTS 4,461,007 A * 7/1984 Burnham .................. H01S 5/10
372/50.12
4,878,724 A * 11/1989 Thaniyavarn ......... H01S 5/4025
372/33
(Continued)

FOREIGN PATENT DOCUMENTS

CN 103125053 A 5/2013
CN 105830292 A 8/2016
(Continued)

*Primary Examiner* — Sean P Hagan
(74) *Attorney, Agent, or Firm* — Harrity & Harrity, LLP

(57) ABSTRACT

An optical semiconductor device includes a semiconductor substrate; a plurality of mesa stripes, which are arranged side by side on the semiconductor substrate, and each of which includes an active layer and a diffraction grating, the diffraction grating extending up to a back end surface of each of the plurality of mesa stripes; a plurality of electrodes, each of which is electrically connected to an upper surface of a corresponding one of the plurality of mesa stripes, having a pad portion for wire bonding; a plurality of waveguides, each of which is optically connected to the active layer of a corresponding one of the plurality of mesa stripes; and a reflective film provided at back end surfaces of the plurality of mesa stripes, and wherein at least two mesa stripes, of the plurality of mesa stripes, are configured to be driven at the same time.

20 Claims, 11 Drawing Sheets

(51) Int. Cl.
*H01S 5/042* (2006.01)
*H01S 5/12* (2021.01)
*H01S 5/22* (2006.01)
*H01S 5/227* (2006.01)
*H01S 5/40* (2006.01)
*H01S 5/50* (2006.01)
*G02B 6/42* (2006.01)
*H01S 5/02345* (2021.01)
*H01S 5/0237* (2021.01)

(52) U.S. Cl.
CPC .......... *H01S 5/4068* (2013.01); *H01S 5/4075* (2013.01); *H01S 5/4087* (2013.01); *H01S 5/50* (2013.01); *G02B 6/4281* (2013.01); *H01S 5/02345* (2021.01); *H01S 5/0237* (2021.01); *H01S 5/0265* (2013.01); *H01S 5/0287* (2013.01); *H01S 5/0427* (2013.01); *H01S 5/2224* (2013.01)

(56) References Cited

U.S. PATENT DOCUMENTS

| | | | | |
|---|---|---|---|---|
| 4,977,570 | A * | 12/1990 | Hasegawa | H01S 5/4031 372/50.12 |
| 5,305,342 | A * | 4/1994 | Ota | H01S 5/4031 372/50.12 |
| 5,561,682 | A * | 10/1996 | Aoki | H01S 5/4031 372/50.11 |
| 6,630,366 | B2 | 10/2003 | Taniguchi et al. | |
| 7,242,699 | B2 * | 7/2007 | Arimoto | H01S 5/4068 372/20 |
| 10,554,013 | B2 | 2/2020 | Kurobe et al. | |
| 10,574,033 | B2 | 2/2020 | Kitatani et al. | |
| 11,322,912 | B2 | 5/2022 | Itoh et al. | |
| 2006/0146902 | A1 * | 7/2006 | Ikoma | H01S 5/12 372/43.01 |
| 2009/0245313 | A1 * | 10/2009 | Karino | H01S 5/227 372/46.012 |
| 2010/0111129 | A1 * | 5/2010 | Nakashima | H01S 5/4031 372/46.012 |
| 2012/0314725 | A1 * | 12/2012 | Nakanishi | H01S 5/0265 385/14 |
| 2014/0147129 | A1 | 5/2014 | Brenot et al. | |
| 2017/0250521 | A1 * | 8/2017 | Nakamura | H01S 5/1064 |
| 2018/0083417 | A1 * | 3/2018 | Pezeshki | G02B 6/12004 |

FOREIGN PATENT DOCUMENTS

| | | |
|---|---|---|
| CN | 106663916 A | 5/2017 |
| JP | 2000012952 A | 1/2000 |
| JP | 2000269601 A | 9/2000 |
| JP | 2002289971 A | 10/2002 |
| JP | 2004319893 A | 11/2004 |
| JP | 2009088129 A | 4/2009 |
| JP | 2010263153 A | 11/2010 |
| JP | 2013077753 A | 4/2013 |
| JP | 2014165393 A | 9/2014 |
| JP | 2016-154263 A | 8/2016 |
| JP | 2017098342 A | 6/2017 |
| JP | 2018093002 A | 6/2018 |

* cited by examiner

OPTICAL SEMICONDUCTOR DEVICE, OPTICAL SUBASSEMBLY, AND OPTICAL MODULE

CROSS-REFERENCE TO RELATED APPLICATION

The present application claims priority from Japanese patent application JP 2019-076530 filed on Apr. 12, 2019, which is hereby expressly incorporated by reference herein.

TECHNICAL FIELD

The present disclosure relates to an optical semiconductor device, an optical sub-assembly, and an optical module, and more particularly, to a technology of producing a diffraction grating stably to achieve higher yield.

BACKGROUND

Optical modules may include a plurality of light emitting devices. In such an optical module, a plurality of optical fibers are respectively connected to the plurality of light emitting devices of the optical module, and the optical module transmits an optical signal to each of the plurality of optical fibers.

An optical module may include a plurality of optical transmitters and an integrated circuit assembly for controlling the plurality of optical transmitters. The integrated circuit assembly includes chip identification pads.

However, when the plurality of light emitting devices are separately incorporated in the optical module, optical components are required for each of the plurality of light emitting devices, which leads to a problem of increasing manufacturing cost. To address this problem, it is desired, in view of cost saving, to adopt an optical semiconductor device being an array device in which a plurality of light emitting devices are integrated on one semiconductor substrate. With regard to such an optical semiconductor device, however, the optical semiconductor device is not allowed as a product when any failure occurs in even one of the plurality of light emitting devices thus integrated. The optical semiconductor device being the array device has a yield corresponding to the product of yields of the light emitting devices. Thus, in order to achieve higher yield of the optical semiconductor device, it is important to improve the yield of each light emitting device.

In particular, when each light emitting device has a diffraction grating that extends up to a back end surface, and a reflective film formed on the back end surface, a side mode suppression ratio (SMSR) failure intrinsically occurs in the light emitting devices at a certain ratio. Therefore, the optical semiconductor device being the array device involves considerable reduction in yield and increase in cost compared with a single light emitting device.

SUMMARY

According to some possible implementations, an optical semiconductor device includes a semiconductor substrate; a plurality of mesa stripes, which are arranged side by side on the semiconductor substrate, and each of which includes an active layer and a diffraction grating, the diffraction grating extending up to a back end surface of each of the plurality of mesa stripes; a plurality of electrodes, each of which is electrically connected to an upper surface of a corresponding one of the plurality of mesa stripes, having a pad portion for wire bonding; a plurality of waveguides, each of which is optically connected to the active layer of a corresponding one of the plurality of mesa stripes; and a reflective film provided at back end surfaces of the plurality of mesa stripes and having a reflectivity of 30% or more, wherein a center-to-center distance at back end surfaces of two mesa stripes at both ends of the plurality of mesa stripes is 150 µm or less, and wherein at least two mesa stripes, of the plurality of mesa stripes, are configured to be driven at the same time.

According to some possible implementations, an optical sub-assembly includes an optical semiconductor device includes a semiconductor substrate; a plurality of mesa stripes, which are arranged side by side on the semiconductor substrate, and each of which includes an active layer and a diffraction grating, the diffraction grating extending up to a back end surface of each of the plurality of mesa stripes; a plurality of electrodes, each of which is electrically connected to an upper surface of a corresponding one of the plurality of mesa stripes, having a pad portion for wire bonding; a plurality of waveguides, each of which is optically connected to the active layer of a corresponding one of the plurality of mesa stripes; and a reflective film provided at back end surfaces of the plurality of mesa stripes and having a reflectivity of 30% or more, wherein a center-to-center distance at back end surfaces of two mesa stripes at both ends of the plurality of mesa stripes is 150 µm or less, and wherein at least two mesa stripes, of the plurality of mesa stripes, are configured to be driven at the same time. The optical sub-assembly also includes a plurality of wires wire-bonded to the plurality of electrodes and a driver configured to output an electric signal for driving the optical semiconductor device.

According to some possible implementations, an optical module includes an optical sub-assembly includes an optical semiconductor device includes a semiconductor substrate; a plurality of mesa stripes, which are arranged side by side on the semiconductor substrate, and each of which includes an active layer and a diffraction grating, the diffraction grating extending up to a back end surface of each of the plurality of mesa stripes; a plurality of electrodes, each of which is electrically connected to an upper surface of a corresponding one of the plurality of mesa stripes, having a pad portion for wire bonding; a plurality of waveguides, each of which is optically connected to the active layer of a corresponding one of the plurality of mesa stripes; and a reflective film provided at back end surfaces of the plurality of mesa stripes and having a reflectivity of 30% or more, wherein a center-to-center distance at back end surfaces of two mesa stripes at both ends of the plurality of mesa stripes is 150 µm or less, and wherein at least two mesa stripes, of the plurality of mesa stripes, are configured to be driven at the same time. The optical sub-assembly also includes a plurality of wires wire-bonded to the plurality of electrodes and a driver configured to output an electric signal for driving the optical semiconductor device.

DETAILED DESCRIPTION

The following detailed description of example implementations refers to the accompanying drawings. The same reference numbers in different drawings may identify the same or similar elements.

Figure 1:
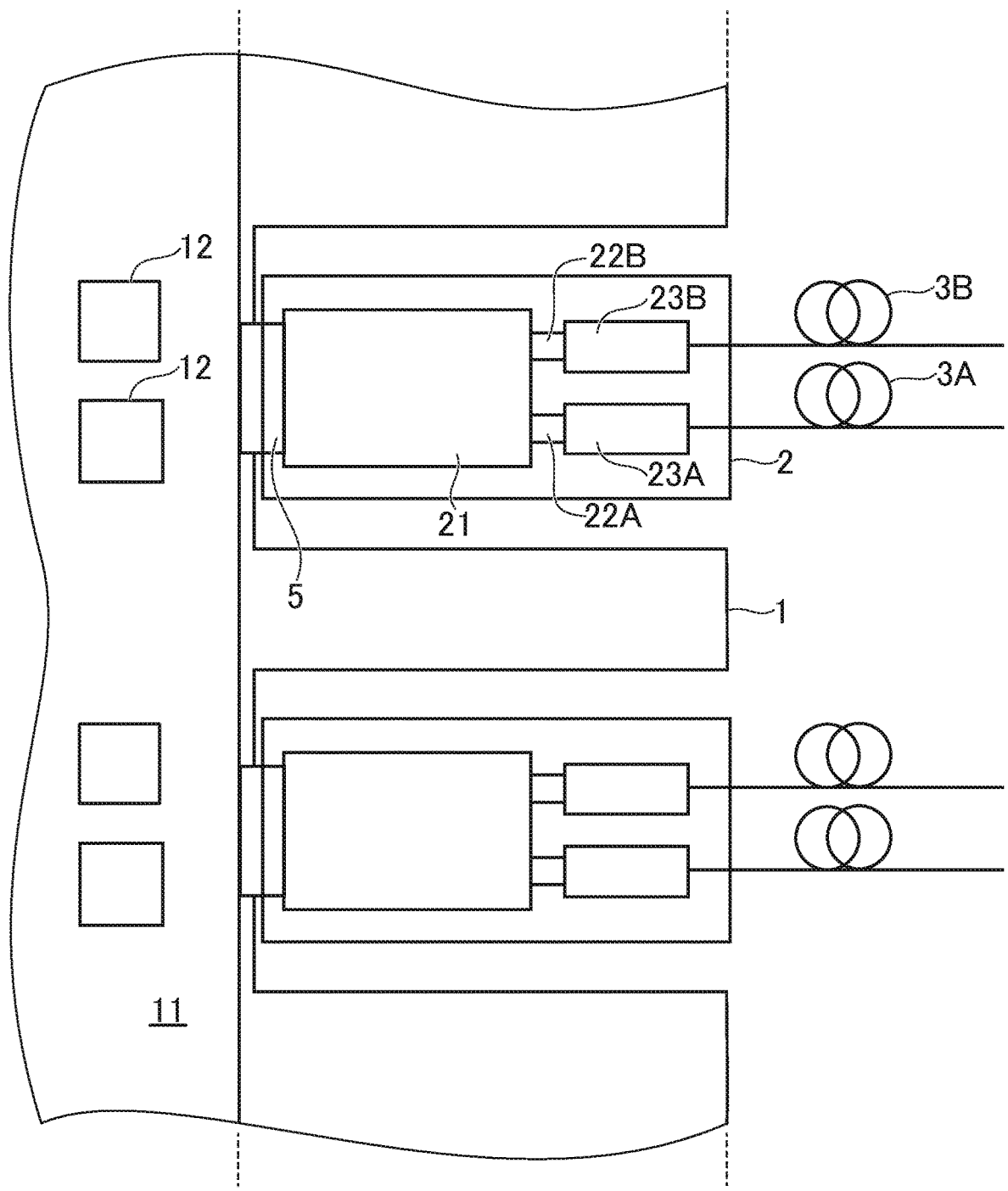
FIG. 1 is a schematic view for illustrating a configuration of an optical transmission equipment and an optical module according to an example.

FIG. 1 is a schematic view for illustrating a configuration of an optical transmission equipment 1 and an optical module 2 in an implementation. The optical transmission equipment 1 includes a printed circuit board (PCB) 11 and ICs 12. The optical transmission equipment 1 is, for example, a large-capacity router or a switch. The optical transmission equipment 1 has, for example, a function of a switchboard, and is provided in a base station or the like. A plurality of optical modules 2 are mounted to the optical transmission equipment 1. Reception data (reception electric signal) is acquired from the optical module 2. Determination of a destination and a kind of data to be transmitted is made through use of the ICs 12 or the like, and transmission data (transmission electric signal) is generated. Then, the data is transmitted to a corresponding one of the optical modules 2 through the printed circuit board 11.

The optical module 2 is a transceiver having a transmission function and a reception function. The optical module 2 includes a printed circuit board 21, an optical reception module 23A, and an optical transmission module 23B. The optical reception module 23A is configured to convert an optical signal received through an optical fiber 3A into an electric signal. The optical transmission module 23B is configured to convert the electric signal into an optical signal and transmit the optical signal to an optical fiber 3B. The printed circuit board 21 is connected to the optical reception module 23A and the optical transmission module 23B via flexible printed circuits 22A and 22B (FPC), respectively. The electric signal is transmitted from the optical reception module 23A to the printed circuit board 21 through the flexible board 22A, and the electric signal is transmitted from the printed circuit board 21 to the optical transmission module 23B through the flexible board 22B. The optical module 2 and the optical transmission equipment 1 are connected to each other via an electric connector 5. The optical reception module 23A and the optical transmission module 23B are electrically connected to the printed circuit board 21. The optical reception module 23A is configured to convert the optical signal into the electric signal, and the optical transmission module 23B is configured to convert the electric signal into the optical signal. In this case, the optical reception module 23A includes one or more optical sub-assemblies, and the optical transmission module 23B includes one or more optical sub-assemblies.

An optical transmission system in the first implementation includes two or more optical transmission equipments 1, two or more optical modules 2, and one or more optical fibers 3. One or more optical modules 2 are connected to each optical transmission equipment 1. The optical fibers 3 connect the optical modules 2 respectively connected to two optical transmission equipments 1. Transmission data generated by one optical transmission equipment 1 is converted into an optical signal by the optical module 2 connected to the one optical transmission equipment 1, and the optical signal is transmitted to the optical fiber 3. The optical signal transmitting on the optical fiber 3 is received by the optical module 2 connected to another optical transmission equipment 1, and the optical module 2 converts the optical signal into an electric signal and transmits the electric signal as reception data to the another optical transmission equipment 1.

Figure 2:
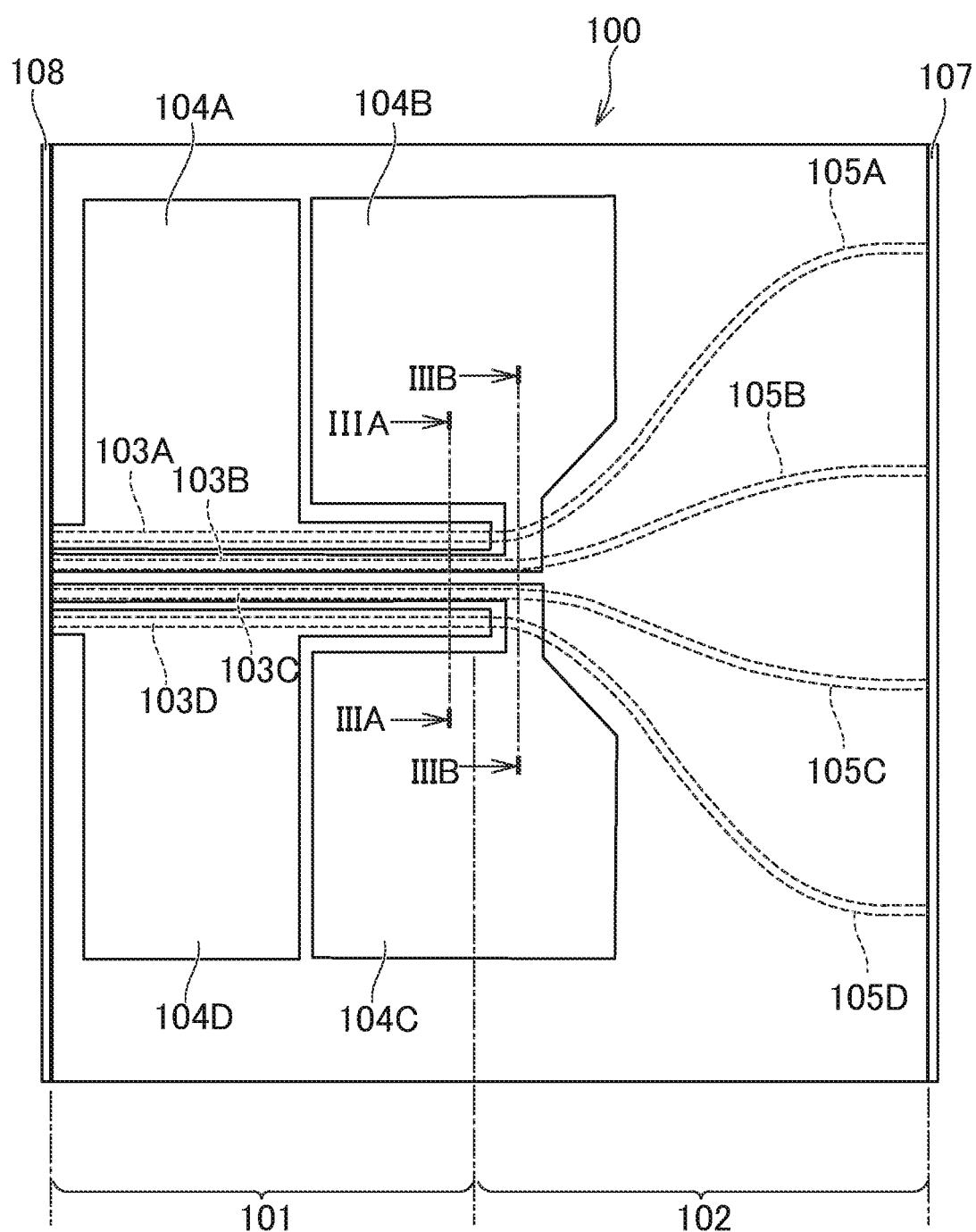
FIG. 2 is a plan view for illustrating a semiconductor laser device.

FIG. 2 is a plan view for illustrating a semiconductor laser device 100. The semiconductor laser device 100 in the first implementation is an optical semiconductor device being an array device in which a plurality of (in this example, four) distributed feedback (DFB) lasers (laser diodes (LDs)) are integrated. The semiconductor laser device 100 is a direct-modulation type device. The distributed feedback laser is hereinafter referred to as "DFB-LD". Output beams emitted from the plurality of DFB-LDs have a wavelength in a 1.3-μm band. The semiconductor laser device 100 is an optical semiconductor device to be incorporated in any one of the one or more optical sub-assemblies included in the optical transmission module 23B of FIG. 1. As illustrated in FIG. 2, the semiconductor laser device 100 includes a laser region 101 and a waveguide region 102. In the laser region 101 for forming the DFB-LDs, mesa stripes 103 are formed. Those mesa stripes 103, which are denoted by mesa stripes 103A, 103B, 103C, and 103D, are arranged in order from the left side to the right side (from the upper side to the lower side of FIG. 2) as viewed from a beam exit direction. There are arranged p-side electrodes 104, which are brought into physical contact with upper surfaces of the mesa stripes 103 to be electrically connected thereto. In FIG. 2, p-side electrodes 104A, 104B, 104C, and 104D are illustrated, which are to be electrically connected to the upper surfaces of the mesa stripes 103A, 103B, 103C, and 103D, respectively.

In the waveguide region 102, waveguides 105 are provided, which are to be optically connected to an active layer 112 (as described below) of each mesa stripe 103. In FIG. 2, waveguides 105A, 105B, 105C, and 105D are illustrated, which are to be connected to the mesa stripes 103A, 103B, 103C, and 103D, respectively. The waveguides 105A, 105B, 105C, and 105D extend outward on both sides across an extending direction of the mesa stripes 103A, 103B, 103C, and 103D. The waveguides 105A, 105B, 105C, and 105D extend outward in a symmetric manner with respect to a center line of the mesa stripes 103B and 103C. Specifically, the waveguides 105A and 105B extend outward to the left side (upper side of FIG. 2) as viewed from the beam exit direction, and the waveguides 105C and 105D extend outward to the right side (lower side of FIG. 2) as viewed from the beam exit direction.

At a front end surface (end surface on the beam exit side: end surface on the right side of FIG. 2) of the semiconductor laser device 100, an anti-reflection film 107 (AR film) is formed, and at a back end surface (that is, back end surface of each of the plurality of mesa stripes 103: end surface on the left side of FIG. 2) thereof, a high-reflection film 108 (HR film) is formed. It is desired that the anti-reflection film 107 have a reflectivity of 5% or less. The reflectivity of the high-reflection film 108 is desirably 30% or more, more desirably 50% or more, still more desirably 70% or more.

Figure 3A:
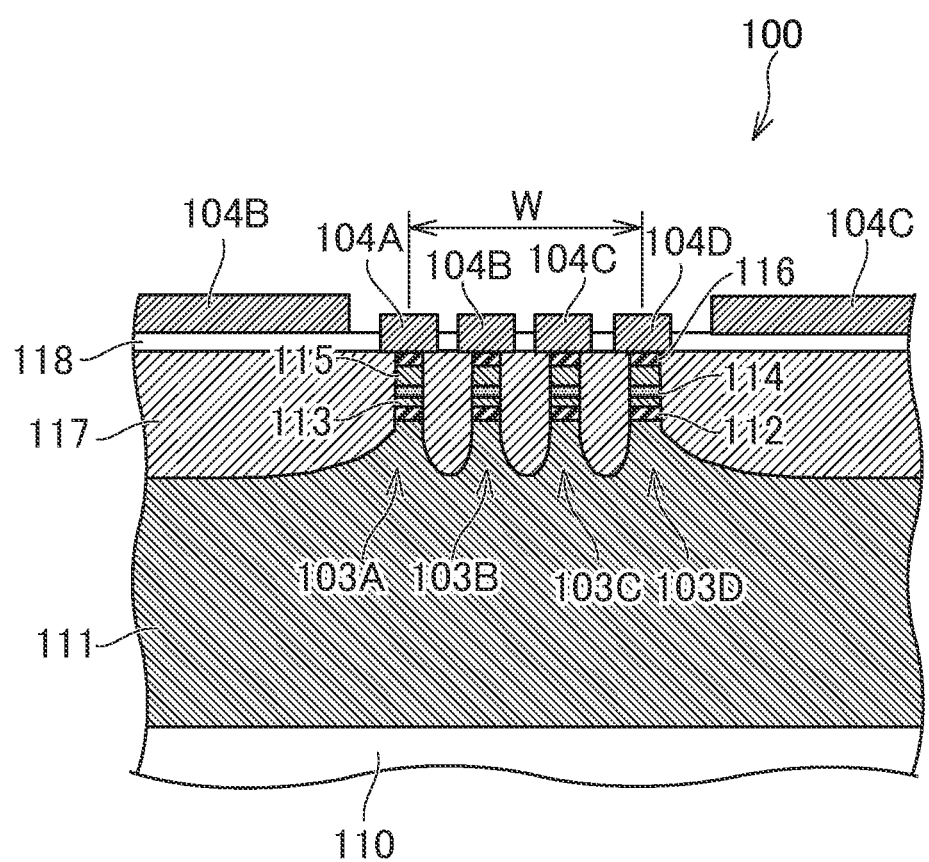
FIG. 3A is a sectional view for illustrating the structure of a laser region of the semiconductor laser device.

FIG. 3A is a sectional view for illustrating the structure of the laser region 101 of the semiconductor laser device 100. FIG. 3A is a sectional view taken along the line IIIA-IIIA of FIG. 2. The semiconductor laser device 100 includes an n-type InP substrate 110 (semiconductor substrate), the plurality of mesa stripes 103, and the plurality of p-side electrodes 104 (electrodes). As illustrated in FIG. 3A, the n-type InP substrate 110 has formed thereon an n-type InP cladding layer 111, the active layer 112 (multiquantum well layer), a p-type InP spacer layer 113, a diffraction grating layer 114, a p-type InP cladding layer 115, and a p-type contact layer 116, which are laminated in order. In a semiconductor multilayer including an upper portion of the n-type InP cladding layer 111, the active layer 112, the p-type InP spacer layer 113, the diffraction grating layer 114, the p-type InP cladding layer 115, and the p-type contact layer 116, portions outside a region serving as an optical waveguide in each DFB-LD are removed, and the semiconductor multilayer has a mesa stripe structure. The diffraction grating layer 114 is formed to have a periodic shape with respect to the extending direction of the mesa stripes 103, and functions as a diffraction grating. The periodic shape of the diffraction grating layer 114 extends up to the back end surfaces of the mesa stripes 103 (also defined as the back surface of the semiconductor laser device 100). The diffraction grating layer 114 is located between the p-type InP spacer layer 113 and the p-type InP cladding layer 115. When the p-type InP spacer layer 113 and the p-type InP cladding layer 115 are assumed as one p-type cladding layer, the diffraction grating layer 114 may be considered to be located inside the p-type cladding layer. Each DFB-LD includes one mesa stripe, and the plurality of mesa stripes are arranged side by side on the semiconductor substrate. The mesa stripes each include the active layer and the diffraction grating and in addition, the diffraction grating extends up to the back end surfaces thereof.

In regions on both sides of each of the plurality of mesa stripes 103, that is, regions between adjacent two mesa stripes 103, and regions outside the mesa stripes 103 located at both ends, a high-resistance InP layer 117 is buried. The semiconductor laser device 100 has a buried-hetero (BH) structure. An insulating film 118 is formed to cover the plurality of mesa stripes 103 and the high-resistance InP layer 117, but the insulating film 118 is removed in at least a part of the upper surface of each of the plurality of mesa stripes 103. Moreover, the plurality of p-side electrodes 104 are formed on the insulating film 118, but each p-side electrode 104 is brought into physical contact, and electrically connected, with the upper surface of a corresponding mesa stripe 103. The p-side electrodes 104 each have a predetermined shape as described below. Although not shown, a common n-side electrode corresponding to each p-side electrode 104 is formed on a back surface of the n-type InP substrate 110.

Figure 3B:
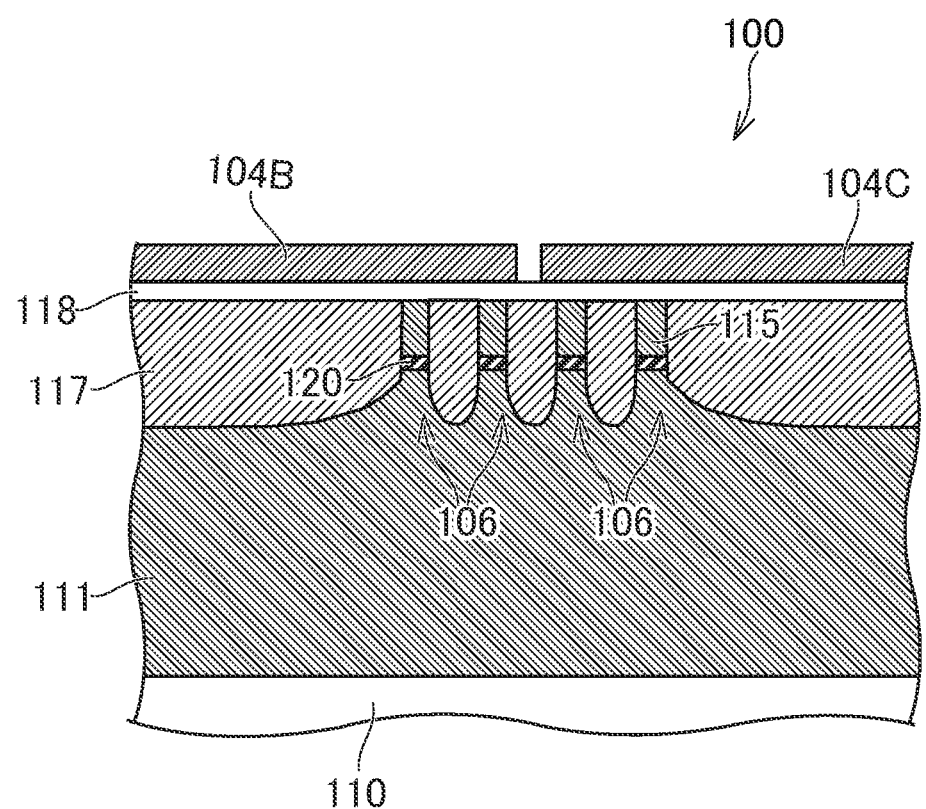
FIG. 3B is a sectional view for illustrating the structure of a waveguide region of the semiconductor laser device.

FIG. 3B is a sectional view for illustrating the structure of the waveguide region 102 of the semiconductor laser device 100. FIG. 3B is a sectional view taken along the line IIIB-IIIB of FIG. 2. As illustrated in FIG. 3B, the n-type InP substrate 110 has formed thereon the n-type InP cladding layer 111, a waveguide layer 120, and the p-type InP cladding layer 115, which are laminated in order. A semiconductor multilayer including the upper portion of the n-type InP cladding layer 111, the waveguide layer 120, and the p-type InP cladding layer 115 has a mesa stripe structure. The above-mentioned mesa stripe structure is defined as mesa stripes 106 in order to distinguish those from the mesa stripes 103 in the laser region 101. The waveguide region 102 of each DFB-LD includes one mesa stripe 106, and the mesa stripes 106 are formed on the n-type InP substrate 110, and include the waveguide layer 120.

In regions on both sides of each of the plurality of mesa stripes 106, as in the plurality of mesa stripes 103 in the laser region 101, the high-resistance InP layer 117 is buried. The insulating film 118 is formed to cover the plurality of mesa stripes 106 and the high-resistance InP layer 117. In the plurality of mesa stripes 106 in the waveguide region 102, the p-type contact layer 116 is not formed, and also the insulating film 118 is not removed in a region corresponding to the upper surface of each mesa stripe 106. Accordingly, unlike the plurality of mesa stripes 103 in the laser region 101, the plurality of mesa stripes 106 are not electrically connected to the p-side electrodes 104 that cross the mesa stripes 106 as viewed in plan view (transparent waveguide region), and thus this arrangement has no effect on optical output. As illustrated in FIG. 3B, in the waveguide region 102 as well, the plurality of (in this example, two) p-side electrodes 104B and 104C are formed, but the p-side electrodes 104 and the mesa stripes 106 are not electrically connected due to the insulating film 118 formed therebetween.

The waveguide layer 120 of each mesa stripe 106 (specifically, the back end surface of the waveguide layer 120) provided in the waveguide region 102 is butt-joined to the active layer 112 of each mesa stripe 103 (specifically, the front end surface of the active layer 112) provided in the laser region 101. With this, the waveguide layer 120 of each mesa stripe 106 provided in the waveguide region 102 forms each waveguide 105. Thus, the active layer 112 of each mesa stripes 103 in the laser region 101 and a corresponding waveguide 105 are optically connected to each other. Each DFB-LD includes one corresponding mesa stripe 103 in the laser region 101.

The p-side electrodes 104 are electrodes with pad portions for wire bonding. The pad portions of the p-side electrodes 104A and 104B spread on the left side (upper side of FIG. 2) as viewed from the beam exit direction, and the pad portions of the p-side electrodes 104C and 104D spread on the right side (lower side of FIG. 2) as viewed from the beam exit direction. The p-side electrode 104A (104D) is electrically connected to the upper surface of the mesa stripe 103A (103D), and also extends from a back portion of the mesa stripe 103A (103D) to the left side (to the right side) as viewed from the beam exit direction. The extending portion corresponds to the pad portion. The p-side electrode 104B (104C) is electrically connected to the upper surface of the mesa stripe 103B (103C), and also further extends forward (that is, in the beam exit direction) and is bent to the left side (to the right side) as viewed from the beam exit direction. The p-side electrode 104B (104C) further spreads on the left side (on the right side) as viewed from the beam exit direction so as to surround the p-side electrode 104A (104D) instead of being in contact with the p-side electrode 104A (104D). This portion corresponds to the pad portion. The p-side electrode 104B (104C) crosses the two waveguides 105A and 105B (105C and 105D) as viewed in plan view. In such a region, however, the p-side electrodes 104 are not electrically connected to the mesa stripes 106 due to the insulating film 118 formed therebetween, and hence, this arrangement has no effect on the optical output as described above.

Figure 4:
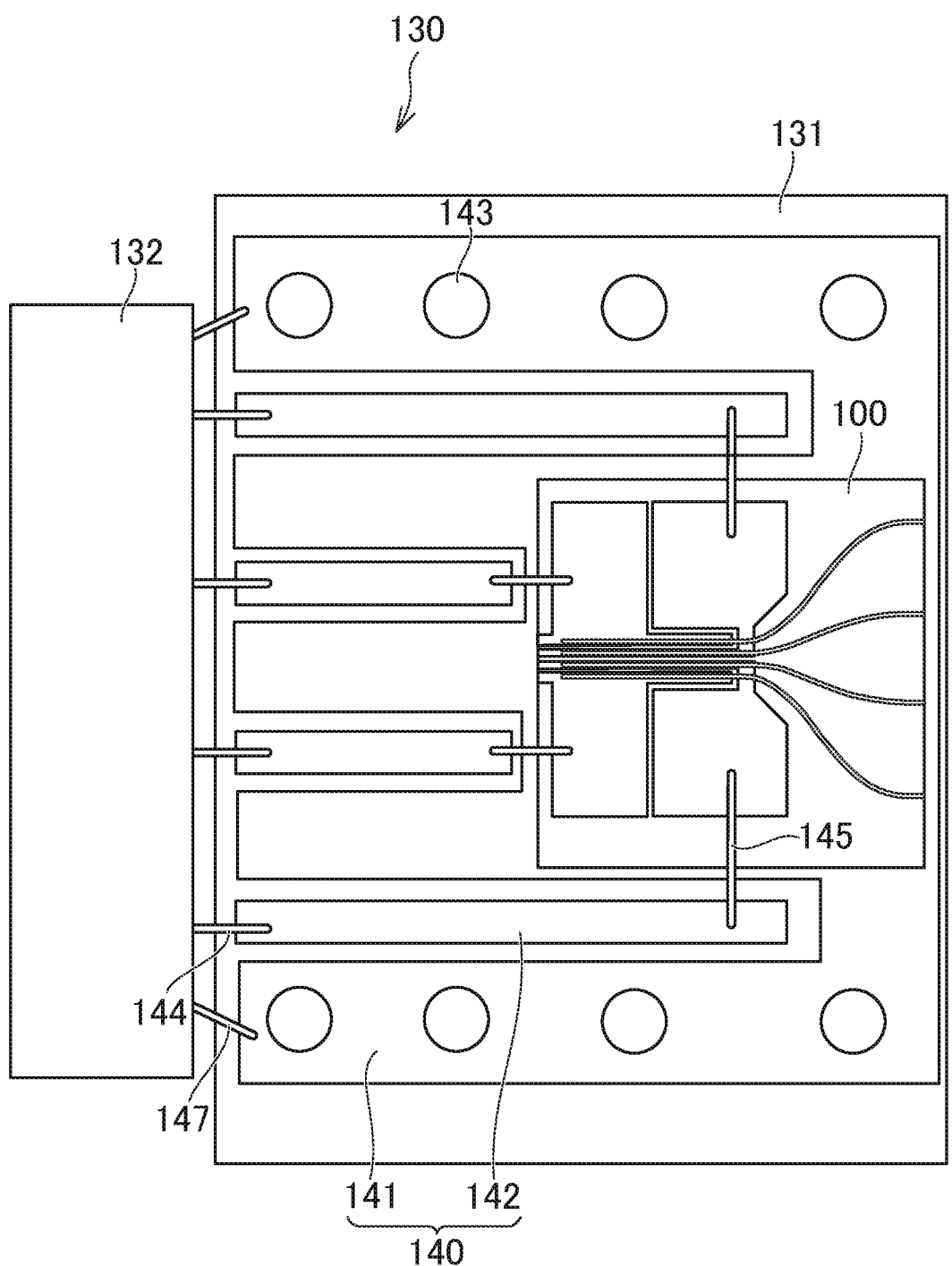
FIG. 4 is a plan view for illustrating main components of an optical sub-assembly.

FIG. 4 is a plan view for illustrating main components of an optical sub-assembly 130. The optical sub-assembly 130 is any one of the one or more optical sub-assemblies included in the optical transmission module 23B of FIG. 1.

The optical sub-assembly 130 includes the semiconductor laser device 100, a sub-mount 131, and a driver 132. The driver 132 may be provided outside the optical sub-assembly 130. On an upper surface of the sub-mount 131, an electrode pattern 140 is formed. The electrode pattern 140 includes a cathode electrode 141 and a plurality of (in this example, four) anode electrodes 142. The n-side electrode of the semiconductor laser device 100 and the cathode electrode 141 are electrically and physically connected by soldering, for example. The sub-mount 131 has formed therein a plurality of via holes 143, and the cathode electrode 141 is electrically connected to a cathode electrode provided on a back surface of the sub-mount 131 through the via holes 143 and further electrically connected to a housing of the optical sub-assembly 130. The driver 132 and the plurality of anode electrodes 142 are connected to each other via wires 144. Further, the driver 132 and the cathode electrode 141 are also connected via wires 147. Further, each of the plurality of anode electrodes 142 and a corresponding one of the p-side electrodes 104 of the semiconductor laser device 100 are connected via a wire 145. The wires 145 are wire-bonded to the pad portions of the p-side electrodes 104. The driver 132 outputs four electric signals for driving the four DFB-LDs integrated in the semiconductor laser device 100 to corresponding four terminals. The driver 132 outputs to a corresponding terminal an electric signal for a DFB-LD to be driven. The electric signal is input to a corresponding p-side electrode 104 via a corresponding anode electrode 142. With the thus-input electric signal, the corresponding DFB-LD is driven. When the driver 132 outputs two electric signals to corresponding two terminals so as to drive two DFB-LDs of the four DFB-LDs, the two DFB-LDs are driven at the same time. When the driver 132 outputs four electric signals to corresponding four terminals so as to drive all of the four DFB-LDs, the four DFB-LDs are all driven at the same time. In this example, the cathode electrode is a common electrode, and this configuration is for single-ended drive.

The semiconductor laser device 100 is formed of the direct-modulation type DFB-LDs, and hence an electric signal for driving is input to each p-side electrode 104 that is electrically connected to a corresponding mesa stripe 103 in the laser region 101. However, in a case of the semiconductor laser device being an optical semiconductor device in which a plurality of DFB-LDs and a plurality of modulators are integrated, an electric signal for driving is input to an electrode of each modulator.

A main feature of the semiconductor laser device 100 resides in that a center-to-center distance W at the back end surfaces of the two mesa stripes 103 at both ends of the plurality of mesa stripes 103 arranged in the laser region 101 is 150 μm or less, and at least two mesa stripes 103 of the plurality of mesa stripes 103 (that is, at least two DFB-LDs of the plurality of DFB-LDs) are driven at the same time. It is further desired that all of the plurality of mesa stripes 103 (that is, the plurality of DFB-LDs) be driven at the same time. Herein, the center-to-center distance of the two mesa stripes 103 refers to a distance between a midpoint of a width of one mesa stripe 103 and a midpoint of a width of another mesa stripe 103. The width refers to a length of each mesa stripe 103 in a direction crossing (substantially orthogonal to) the extending direction of each mesa stripe 103. The plurality of mesa stripes 103 arranged in the laser region 101 extend in one direction (right-left direction of FIG. 2) with substantially the same width. The two mesa stripes 103 are arranged with substantially the same distance. Thus, the two mesa stripes 103 have substantially the same center-to-center distance with respect to the extending direction. Description is focused on a phase of the back end surface of the diffraction grating (diffraction grating layer 114) of each mesa stripe 103, and hence the center-to-center distance of the two mesa stripes 103 is assumed to be a center-to-center distance at the back end surfaces thereof. More strictly, the center-to-center distance is assumed to be a center-to-center distance at the back end surfaces of the diffraction grating layer 114 in a lamination direction of the mesa stripes 103 out of the back end surfaces of the mesa stripes 103.

When the light emitting device includes the diffraction grating extending up to the back end surface, and the reflective film formed on the back end surface, it is significantly difficult to control the phases of the back end surfaces of the diffraction grating. Therefore, an SMSR failure intrinsically occurs in such light emitting devices at a certain ratio. Each DFB-LD has the back end surface coated with the high-reflection film so as to achieve high output and low threshold value. In this case, the SMSR of each DFB-LD is determined in accordance with a phase of a corresponding back end surface of the diffraction grating. For example, the diffraction grating of the DFB-LD oscillating in a 1.3-μm band has a significantly small grating pitch, that is, about 200 nm.

Now, a related-art semiconductor laser device is considered. This semiconductor laser device is, for example, an array device in which four DFB-LDs are integrated. In the related-art semiconductor laser device, the four DFB-LDs, that is, four mesa stripes are arranged in order with the same center-to-center distance. For example, when output beams from the four DFB-LDs are coupled to a ribbon fiber including four optical fibers, it is desired that a center-to-center distance at beam exit end surfaces (front end surfaces) of adjacent DFB-LDs, that is, a center-to-center distance of adjacent mesa stripes be determined in accordance with a center-to-center distance of cores of adjacent two optical fibers of the ribbon fiber. The above-mentioned center-to-center distance is from 200 μm to 300 μm, typically, 250 μm. A center-to-center distance of two mesa stripes at both ends is from 600 μm to 900 μm, typically, 750 μm.

As a method of forming the diffraction grating, electron beam lithography is generally used. An electron beam lithography apparatus ensures positional accuracy of about 1 nm for a region of about 1,000 μm$^2$, and ensures parallelism accuracy of 0.02° or less for cleaved facets of the semiconductor substrate. Considering an effect of the positional accuracy on the phases of the back end surfaces of the diffraction grating of the DFB-LDs, the positional accuracy of 1 nm is sufficiently smaller than the diffraction grating pitch of 200 nm, and hence in this example, the effect of positional accuracy is not a problem. Meanwhile, considering the effect of the parallelism accuracy for the cleaved facets of the semiconductor substrate, the parallelism accuracy is 0.02° as described above. Here, sin (0.02°)=0.00033, and at a position shifted by 600 μm in a direction perpendicular to the diffraction grating pitch (extending direction of the mesa stripes), a phase of a corresponding back end surface of the diffraction grating is shifted by 200 nm, that is, by one grating pitch of the diffraction grating.

As described above, the SMSR yield of the array device formed of the DFB-LDs corresponds to the product of SMSR yields of the DFB-LDs as described above, and thus is much lower than the SMSR yield of a single DFB-LD. In the related-art semiconductor laser device, the center-to-center distance of two mesa stripes at both ends of the four mesa stripes is from 600 μm to 900 μm, a phase difference between the back end surfaces of the diffraction grating becomes equal to or larger than one grating pitch. Thus, even when one DFB-LD of the four DFB-LDs causes no SMSR failure, other DFB-LDs are highly liable to cause the SMSR failure. When the SMSR failure occurs in any one of the DFB-LDs of the array device, the array device formed of the DFB-LDs is considered defective, and hence the SMSR yield of the array device is considerably lowered. A main factor that causes reduction in yield of the related-art array device formed of DFB-LDs may be the SMSR failure in each DFB-LD.

In the semiconductor laser device 100 according to some implementations, it is desired, from the viewpoint of stably obtaining the SMSR, that the center-to-center distance of the two mesa stripes 103 at both ends of the plurality of (in this example, four) mesa stripes 103 be determined such that a phase difference of the back end surfaces of the diffraction grating is significantly reduced with respect to one grating pitch. Specifically, it is desired that the above-mentioned center-to-center distance be determined such that the phase difference is reduced to $\pi/2$ (¼ grating pitch) or less. A phase difference of the back end surfaces of the diffraction grating of the two mesa strips 103 at both ends is determined in accordance with the grating pitch of the diffraction grating and the parallelism accuracy for the cleaved facets of the semiconductor substrate obtained with the electron beam lithography apparatus. In a case of the DFB-LDs oscillating in a 1.3-μm band, the back end surfaces of the diffraction grating have a phase difference of one grating pitch when the center-to-center distance of the two mesa stripes 103 is about 600 μm. Thus, in order to suppress the phase difference to ¼ grating pitch or less, it is desired that the center-to-center distance of the two mesa stripes 103 at both ends be 150 μm or less. In the array device in which the plurality of DFB-LDs are integrated in such a range, it is possible to reduce a phase difference of the back end surfaces of the diffraction grating of the plurality of DFB-LDs, and achieve the SMSR yield of the array device closer to that of a single DFB-LD. In other words, when one DFB-LD of the plurality of DFB-LDs integrated in the array device causes no SMSR failure, other DFB-LDs are highly likely to cause no SMSR failure. Therefore, the yield of the semiconductor laser device 100 is considerably increased.

From the viewpoint of stably obtaining the SMSR, it is desired that one adjacent pair of mesa stripes 103 out of the plurality of mesa stripes 103 have as small a center-to-center distance (pitch) as possible. In view of a production accuracy for the mesa stripes 103 and the high-resistance InP layer 117, it is desired that the adjacent two mesa stripes 103 have the center-to-center distance of 20 μm or more. Through reducing the center-to-center distance of the adjacent two mesa stripes 103, the SMSR yield of the semiconductor laser device 100 can be further increased.

In the above-mentioned related-art semiconductor laser device, the center-to-center distance of adjacent two mesa stripes is determined in accordance with the center-to-center distance of the cores of the optical fibers of the ribbon fiber to be connected. In contrast, in the semiconductor laser device 100 according to some implementations, the center-to-center distance of the two mesa stripes 103 at both ends is determined through reducing the phase difference of the back end surfaces of the diffraction grating from the viewpoint of stably obtaining the SMSR. The center-to-center distance of adjacent two mesa stripes 103 is determined in accordance with the center-to-center distance of the two mesa stripes 103 at both ends and a count of the plurality of mesa stripes 103. In other words, in the semiconductor laser device 100 according to some implementations, the center-to-center distance at the front end surfaces (beam exit side end surfaces) of adjacent mesa stripes 103 may become, in some cases, shorter depending on a distance determined in accordance with external optical components to be connected, for example. To address this problem, the semiconductor laser device 100 according to some implementations includes the plurality of waveguides 105 to be respectively connected to the plurality of mesa stripes 103 arranged in the laser region 101, and at least one waveguide 105 out of the plurality of waveguides 105 has a bent portion with respect to the extending direction of a corresponding mesa stripe 103. This waveguide 105 does not entirely extend linearly with respect to the extending direction of the corresponding mesa stripe 103, and a front end surface of the waveguide 105 deviates from the extension of the corresponding mesa stripe 103 in the extending direction. With this structure, the front end surface of the above-mentioned waveguide 105 can be located in a desired position so as to be connected to an external optical component. That is, in the semiconductor laser device 100, exit portions (front end surfaces of the waveguides 105) for output beams from the plurality of DFB-LDs can be set to desired positions.

As illustrated in FIG. 2, in the semiconductor laser device 100 according to some implementations, the plurality of waveguides 105 extend outward on both sides as viewed from the beam exit direction (more strictly, beam exit direction of the mesa stripes 103) in a region from the back end surfaces (portions connected to the mesa stripes 103 in the laser region 101) to the front end surfaces (beam exit end surfaces for the output beams). Adjacent two waveguides 105 out of the plurality of waveguides 105 each have a portion that extends more outward along the beam exit direction compared with corresponding adjacent two mesa stripes 103.

When at least one adjacent pair of waveguides 105 out of the plurality of waveguides 105 each have a portion that extends more outward along the beam exit direction compared with corresponding adjacent two mesa stripes 103, a center-to-center distance at the front end surfaces of the one adjacent pair of waveguides 105 can be set longer than a center-to-center distance at the back end surfaces thereof. Thus, those waveguides 105 can be connected, with a desired center-to-center distance, to external optical components at beam exit portions of such one adjacent pair of DFB-LDs (front end surfaces of the one adjacent pair of waveguides 105). It is further desired that every adjacent waveguides 105 of the plurality of waveguides 105 have a portion that extends more outward along the beam exit direction compared with corresponding adjacent mesa stripes. With this structure, every adjacent waveguides 105 can have longer center-to-center distance at the front end surfaces than the center-to-center distance at the back end surfaces, and thus can be connected, with a desired center-to-center distance, to external optical components at beam exit portions of all the DFB-LDs included in the semiconductor laser device 100 (at front end surfaces of all the plurality of waveguides 105). In the semiconductor laser device 100, as in the related-art semiconductor laser device, output beams from the four DFB-LDs of the semiconductor laser device 100 are coupled to the ribbon fiber including four optical fibers. Thus, the center-to-center distance at the front end surfaces of every adjacent waveguides 105 is any value of from 200 μm to 300 μm, typically, 250 μm. In this example, the center-to-center distance of adjacent beam exit ports (in this example, adjacent waveguides 105) of the semiconductor laser device 100 is determined in accordance with the center-to-center distance of cores of adjacent optical fibers of the ribbon fiber, but the present disclosure is not limited thereto. The center-to-center distance of adjacent beam exit ports may be determined, for example, in accordance with a center-to-center distance of adjacent lenses provided in a lens array or other optical components.

The above implementation is optimum for the case of integrating four or more DFB-LDs as in the semiconductor laser device 100. When the number of DFB-LDs to be integrated is increased, a risk of the SMSR failure occurring in at least one of the plurality of DFB-LDs is accordingly increased, but according to some implementations, the SMSR yield can be increased. Further, when the number of DFB-LDs to be integrated is increased, electrodes provided in the plurality of DFB-LDs are accordingly complicated in shape. In view of this disadvantage, it is desired that the number of DFB-LDs to be integrated be four or less. It is further desired to integrate four DFB-LDs.

The plurality of mesa stripes 103 included in the semiconductor laser device 100 emit beams having substantially the same wavelength in the 1.3-μm band, but the present disclosure is not limited thereto. The plurality of mesa stripes 103 may emit beams having wavelengths that are different among the mesa stripes 103 (or some mesa stripes 103) as required as long as those wavelengths are in the same wavelength band. In the case of adopting the different wavelengths, when a wavelength difference is 0.5% or less at most, the effects are obtained more easily.

Figure 5:
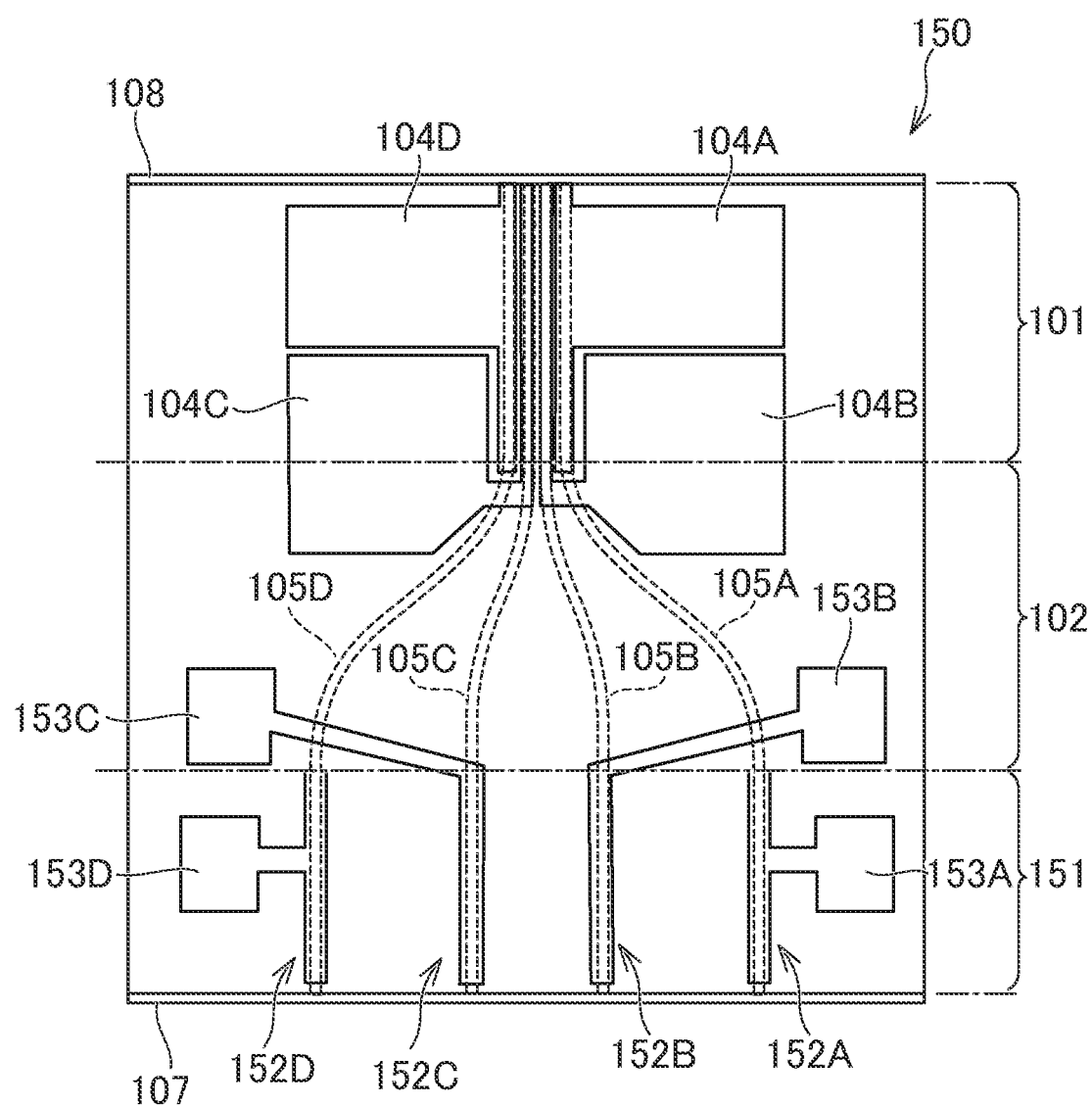
FIG. 5 is a plan view for illustrating a semiconductor laser device according to an example.

A semiconductor laser device 150 may be an optical semiconductor device in which a plurality of DFB-LDs and a plurality of modulators are integrated. FIG. 5 is a plan view for illustrating the semiconductor laser device 150. The semiconductor laser device 150 additionally includes a modulation region 151 in front of the waveguide region 102 (on the beam exit side). The semiconductor laser device 150 further includes a plurality of modulators 152 arranged in the modulation region 151. The semiconductor laser device 150, which includes the modulators 152, is an external-modulation type device, and hence the mesa stripes 103 in the laser region 101 oscillate continuously (continuous wave (CW)). The other structure of the semiconductor laser device 150 is the same as that of the semiconductor laser device 100.

A basic structure of the modulators 152 arranged in the modulation region 151 is known and thus, detailed description thereof is omitted. The modulators 152 include mesa stripes arranged in contact with the mesa stripes 106 arranged in the waveguide region 102. The mesa stripes each include an active layer to be butt-joined to the waveguide layer 120 of a corresponding mesa stripe 106. The modulators 152 include, as in the laser region 101, a plurality of p-side electrodes 153, and are each electrically connected to an upper portion of a corresponding mesa stripe. In FIG. 5, modulators 152A, 152B, 152C, and 152D to be connected to the waveguides 105A, 105B, 105C, and 105D, respectively, are illustrated. Further, p-side electrodes 153A, 153B, 153C, and 153D included in the modulators 152A, 152B, 152C, and 152D, respectively, are illustrated. Similarly to the plurality of p-side electrodes 153 in the laser region 101, some of the plurality of p-side electrodes 153 cross the waveguides 105 as viewed in plan view, but are not electrically connected thereto. Therefore, such arrangement has no effect on optical output.

The semiconductor laser device 150 includes the plurality of waveguides 105, and a center-to-center distance at front end surfaces (portions connected to the modulators 152) of every adjacent waveguides 105 out of the plurality of waveguides 105 can be set longer than a center-to-center distance at back end surfaces thereof (portions connected to the mesa stripes 103). In the modulators 152 in the modulation region 151, adjacent mesa stripes extend linearly, but can be connected, with a desired center-to-center distance, to external output components at beam exit portions of all DFB-LDs included in the semiconductor laser device 150 (at front end surfaces of all the plurality of modulators 152). The semiconductor laser device 150 produces the same effects as those of the semiconductor laser device 100. The waveguide region 102 and the modulation region 151 may be arranged inversely. In this case, each of the plurality of waveguides 105 in the waveguide region 102 is optically connected to the active layer 112 of a corresponding mesa stripe 103 via the modulation region 151 (corresponding modulator 152).

Figure 6:
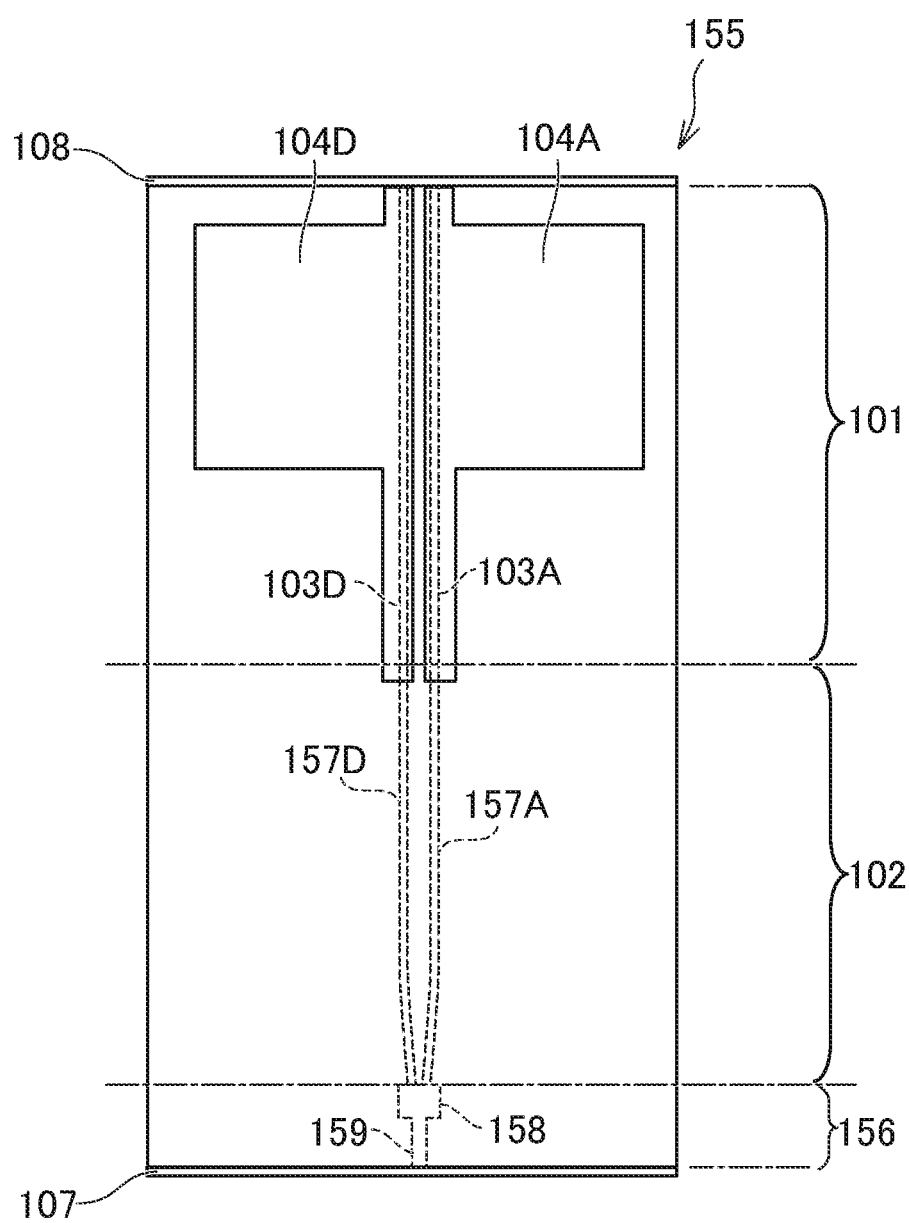
FIG. 6 is a plan view for illustrating a semiconductor laser device according to an example.

A semiconductor laser device 155 may be an optical semiconductor device in which two DFB-LDs and a multimode interference (MMI) multiplexer are integrated. FIG. 6 is a plan view for illustrating the semiconductor laser device 155. The semiconductor laser device 155 includes the laser region 101, the waveguide region 102, and a multiplexing region 156. In the laser region 101, the two mesa stripes 103A and 103D are arranged, and the two p-side electrodes 104A and 104D are arranged to be brought into physical contact, and electrically connected, with upper surfaces of the two mesa stripes 103A and 103D, respectively. In the waveguide region 102, two waveguides 157A and 157D are arranged to be connected to the two mesa stripes 103A and 103D, respectively. The active layer 112 of the mesa stripes 103 arranged in the laser region 101 and the waveguide layer 120 of the mesa stripes 106 arranged in the waveguide region 102 are butt-joined. In the multiplexing region 156, an MMI multiplexer 158 and a waveguide 159 are arranged. The MMI multiplexer 158 is configured to multiplex two optical signals input via the two waveguides 157A and 157D. The waveguide 159 is configured to propagate a multiplexed optical signal output from the MMI multiplexer 158 up to the beam exit end surface.

The structure of the two mesa stripes 103A and 103D and the two p-side electrodes 104A and 104D arranged in the laser region 101 may be different from that of other implementations in that two DFB-LDs oscillate at different wavelengths, but the other structure thereof is the same. Unlike other implementations, only the two mesa stripes 103A and 103D are arranged in the laser region 101. It is desired that the two mesa stripes 103A and 103D (two mesa stripes at both ends) have a center-to-center distance of 150 μm or less. The semiconductor laser device 155 produces the same effects as those of the semiconductor laser device 100.

The two waveguides 157A and 157D arranged in the waveguide region 102 extend linearly from the two mesa stripes 103A and 103D, respectively (with the same center-to-center distance), and then approach each other toward the MMI multiplexer 158 (with the center-to-center distance being gradually decreased) in a region from the back end surfaces to the front end surfaces thereof. The other structure of the two waveguides 157A and 157D is the same as that of the two waveguides 105A and 105D.

The DFB-LDs of the semiconductor laser device 155 are direct-modulation type devices. Two optical signals are output from the two mesa stripes 103A and 103D. The two optical signals from the two mesa stripes 103A and 103D propagate through the two waveguides 157A and 157D, respectively, and are input to the MMI multiplexer 158. The MMI multiplexer 158 multiplexes the two optical signals thus input, and outputs a multi-level optical signal to the waveguide 159 and causes the signal to propagate through the waveguide 159. The semiconductor laser device 155 outputs the multiplexed optical signal (in this example, multiplexed optical signal of two channels) from the front end surface to the outside.

When a beat frequency (difference between two optical signals) of two optical signals to be input to the MMI multiplexer 158 (in this example, substantially the same as the two optical signals output from the two mesa stripes 103A and 103D) is sufficiently higher than a modulation frequency for the two optical signals, a ratio between an amplitude of the optical signal to be output from one mesa stripe 103 out of the two mesa stripes 103A and 103D and an amplitude of the optical signal to be output from another mesa stripe 103 out of the two mesa stripes 103A and 103D is set to be, for example, 1:2 under the control of the driver 132 (see FIG. 4) so that the MMI multiplexer 158 can output a multiplexed optical signal being a multi-level modulation optical signal. This is because the beat between the two optical signals can be suppressed through use of a high-frequency cut filter. In connection with the description "beat frequency of two optical signals to be input to the MMI multiplexer 158 is sufficiently higher than a modulation frequency", the beat frequency is desirably twice or more, more desirably, five times or more, still more desirably ten times or more as large as the modulation frequency.

In the semiconductor laser device 155, the center-to-center distance of the two waveguides 157A and 157D is shorter at the front end surfaces (end surfaces on the MMI multiplexer 158 side) than at the back end surfaces (end surfaces on the mesa stripe 103 side). Also in such a case, at least one (in this example, two) waveguide 157 has a bent portion with respect to the extending direction of the mesa stripes 103, and hence the two optical signals can be output to the MMI multiplexer 158.

Further, in the semiconductor laser device 155, one adjacent pair of (that is, two) mesa stripes 103 and one adjacent pair of (that is, two) waveguides to be optically connected thereto are arranged, but the present disclosure is not limited thereto. The plurality of mesa stripes may include a plurality of adjacent pairs of mesa stripes, and the plurality of waveguides may include a plurality of adjacent pairs of waveguides. Then, the semiconductor laser device may include a plurality of MMI multiplexers to which a plurality of pairs of optical signals are respectively input via the plurality of pairs of waveguides. In any case, when the center-to-center distance of the two mesa stripes at both ends of the plurality of mesa stripes is 150 μm or less, the SMSR yield is drastically increased.

Figure 7:
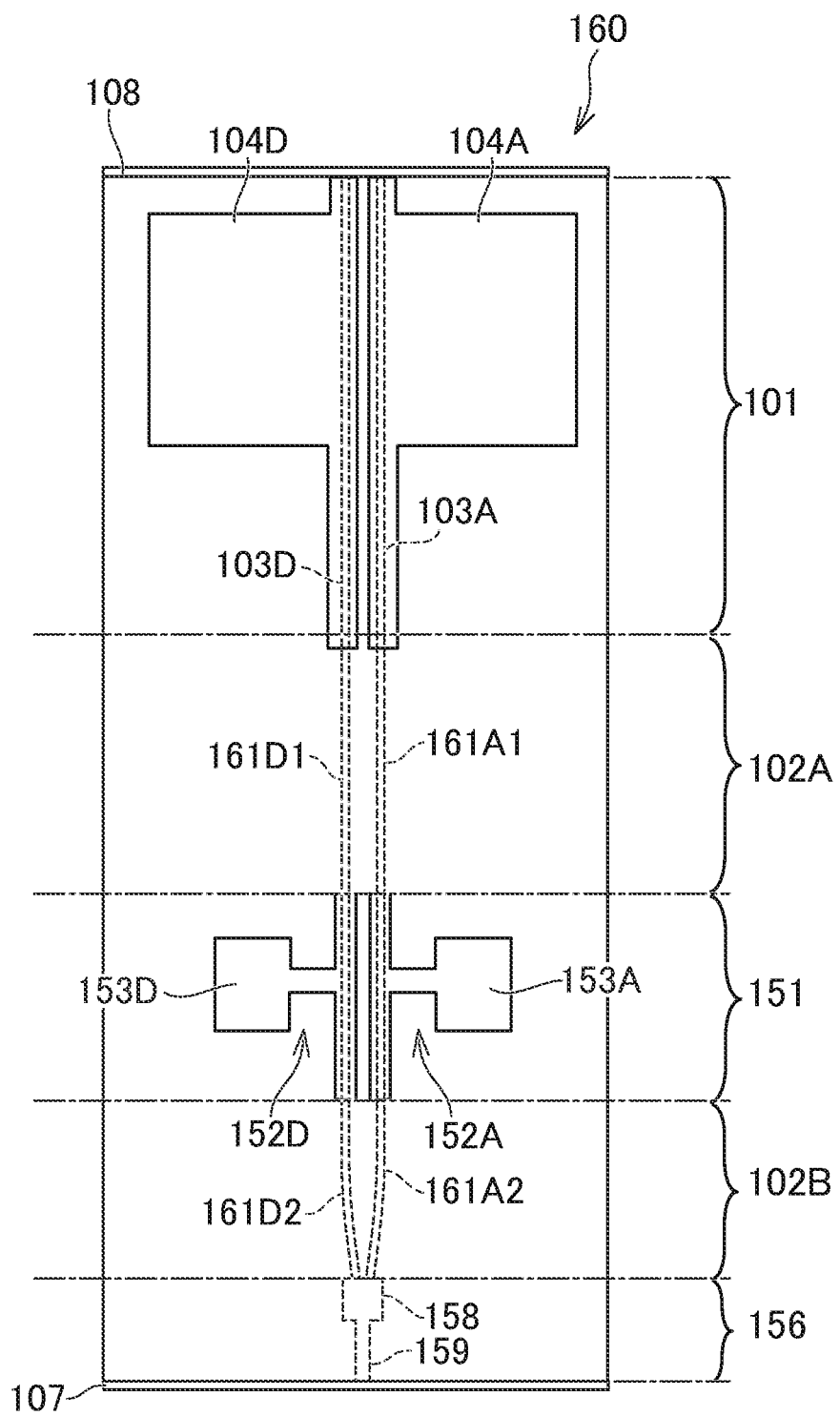
FIG. 7 is a plan view for illustrating a semiconductor laser device according to an example.

A semiconductor laser device 160 is an optical semiconductor device in which a plurality of DFB-LDs, a plurality of modulators, and an MMI multiplexer are integrated. FIG. 7 is a plan view for illustrating the semiconductor laser device 160. The semiconductor laser device 160 has the structure in which the modulators 152 are arranged in the middle of the two waveguides 157A and 157D arranged in the waveguide region 102 of the semiconductor laser device 155 illustrated in FIG. 6. Two DFB-LDs oscillate at different wavelengths, but the semiconductor laser device 160 is an external-modulation type device, and hence the mesa stripes 103 in the laser region 101 continuously oscillate as in other implementations. The other structure of the semiconductor laser device 160 is the same as that of the semiconductor laser device 155.

As illustrated in FIG. 7, the semiconductor laser device 160 includes the laser region 101, a waveguide region 102A, the modulation region 151, a waveguide region 102B, and the multiplexing region 156. As described above, the mesa stripes 103A and 103D in the laser region 101 continuously oscillate unlike other implementations, but the other structure thereof may be the same as that of other implementations. In the waveguide region 102A, two waveguides 161A1 and 161D1 are arranged, which have the same structure as that of the portions (linearly extending portions) on the laser region 101 side of the two waveguides 157A and 157D in other implementations. In the modulation region 151, the modulators 152A and 152D (including p-side electrodes 153A and 153D, respectively) are arranged as in other implementations. In the waveguide region 102B, two waveguides 161A2 and 161D2 are arranged, which have the same structure as that of the portions (a part of linearly extending portions and portions extending to approach each other) on the multiplexing region 156 side of the two waveguides 157A and 157D. In the multiplexing region 156, the MMI multiplexer 158 and the waveguide 159 are arranged, which have the same structure as that of other implementations.

The two mesa stripes 103A and 103D of the semiconductor laser device 160 continuously oscillate, and hence beams propagating through the two waveguides 161A1 and 161D1 are continuous beams, and the continuous beams are converted by the modulators 152A and 152D into two optical signals. Those two optical signals propagate through the two waveguides 161A2 and 161D2, and are input to the MMI multiplexer 158. The semiconductor laser device 160 produces the same effects as those of other implementations.

A semiconductor laser device 165 includes an optical absorber provided in the middle of the waveguide 157A (one waveguide out of one pair of waveguides) provided in the waveguide region 102 of the semiconductor laser device 155, but the other structure of the semiconductor laser device 165 is the same as that of other implementations.

Figure 8:
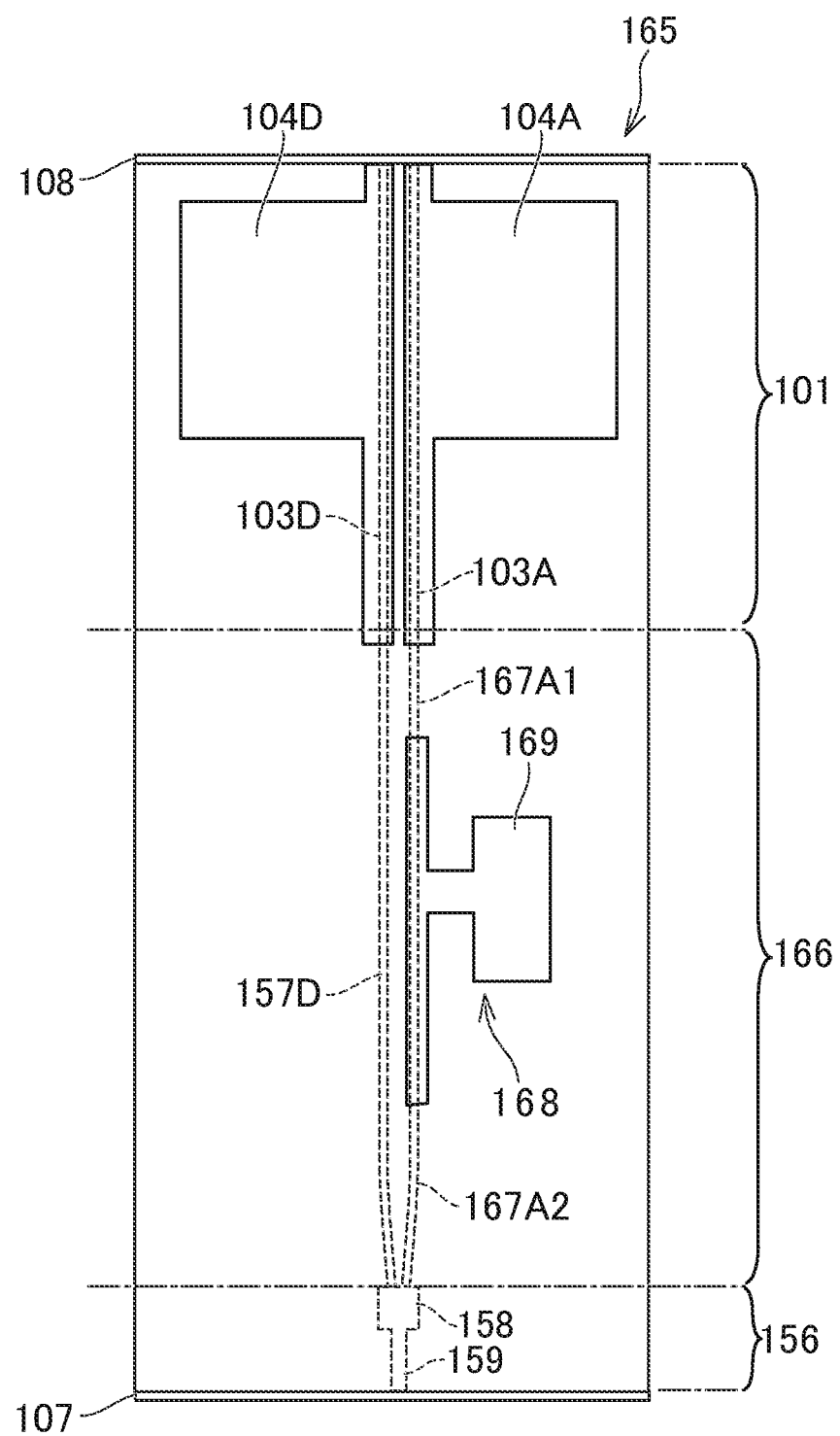
FIG. 8 is a plan view for illustrating a semiconductor laser device according to an example.

FIG. 8 is a plan view for illustrating the semiconductor laser device 165. The semiconductor laser device 165 includes a waveguide/optical absorption region 166 in place of the waveguide region 102. In the waveguide/optical absorption region 166, there are arranged, in addition to the waveguide 157D, a waveguide 167A1, an optical absorber 168, and a waveguide 167A2 in place of the waveguide 157A. As described above, the optical absorber 168 is provided in the middle of the waveguide 157A, and the waveguides 167A1 and 167A2 have the same structure as that of corresponding portions of the waveguide 157A. The optical absorber 168 includes a p-side electrode 169, and the p-side electrode 169 may have a known structure.

According to some implementations, the driver 132 performs control so that the mesa stripe 103A and the mesa stripe 103D output optical signals having different amplitudes. In general, a relaxation oscillation frequency that determines a modulation frequency band for a DFB-LD has high dependency on optical output. Accordingly, when optical outputs (that is, amplitudes) of two DFB-LDs are different, frequency response characteristics vary between the optical outputs. Assuming that a ratio between an amplitude of an optical signal to be output from one mesa stripe 103 and an amplitude of an optical signal to be output from another mesa stripe 103 is set to, for example, 1:2, large distortion may occur in a waveform (combined wavelength) of a multi-level modulation optical signal obtained by multiplexing by the MMI multiplexer 158.

In contrast, the semiconductor laser device 165 produces the same effects as those of the semiconductor laser device 155. In the semiconductor laser device 165, the driver 132 is only required to perform control so that the two mesa stripes 103A and 103D output optical signals having substantially the same amplitude. By the optical absorber 168 absorbing one optical signal, an amplitude of the one optical signal can be reduced. With this structure, the two optical signals to be input to the MMI multiplexer 158 can be adjusted to be closer so as to have substantially the same frequency response characteristics.

The semiconductor laser device 165 includes the optical absorber 168 provided in the middle of one of the waveguides of the semiconductor laser device 155, that is, the waveguide 157A, but the present disclosure is not limited thereto. It is possible to provide the optical absorber 168 in the middle of one of the waveguides of the semiconductor laser device 160. In this case, it is desired to provide the optical absorber 168 in the middle of the waveguide (for example, waveguide 161A2) located in front of the modulators 152.

A semiconductor laser device 170 additionally includes dummy mesa stripes 171 arranged outside of each of the two mesa stripes 103A and 103D at both ends of the plurality of (in this example, four) mesa stripes 103 arranged in the semiconductor laser device 100. However, the other structure of the semiconductor laser device 170 is the same as that of the other implementations.

Figure 9:
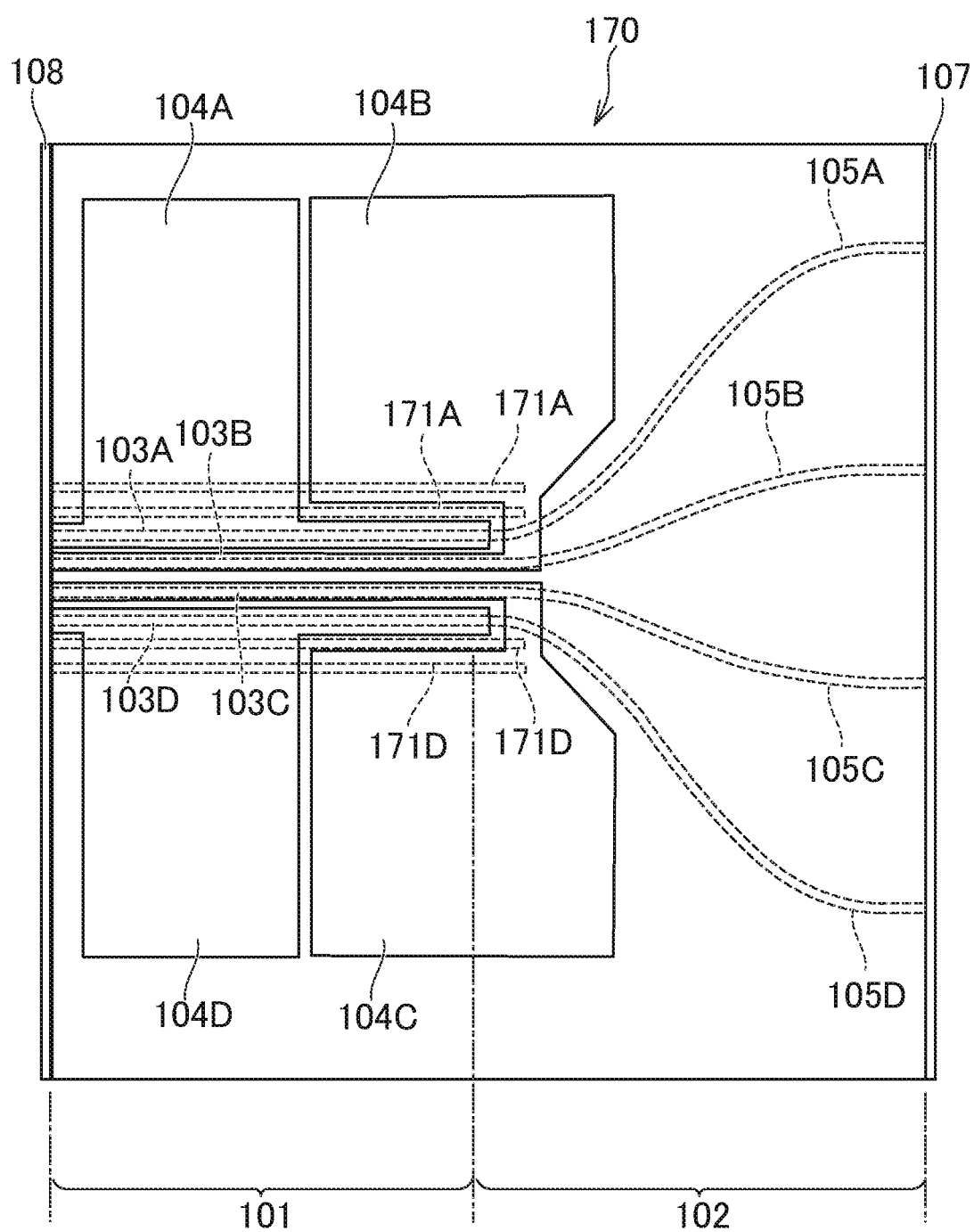
FIG. 9 is a plan view for illustrating a semiconductor laser device according to an example.

FIG. 9 is a plan view for illustrating the semiconductor laser device 170. As illustrated in FIG. 9, two dummy mesa stripes 171A are arranged on the left side (upper side of FIG. 9) outside of the four mesa stripes 103A, 103B, 103C, and 103D arranged in the laser region 101 as viewed from the beam exit direction, and the two dummy mesa stripes 171D are arranged on the right side (lower side of FIG. 9) outside of the four mesa stripes 103A, 103B, 103C, and 103D. The dummy mesa stripes 171A and 171D may have any structure as long as the dummy mesa stripes 171A and 171D are not electrically connected to the plurality of mesa stripes 103 and the plurality of p-side electrodes 104, and have shapes that are not greatly different from the shapes of the mesa stripe 103. On the dummy mesa stripes 171A and 171D, no p-side electrode is provided. From the viewpoint of saving manufacturing cost, it is desired to form the dummy mesa stripes 171A and 171D through a process that is partially in common with a process of forming the mesa stripes 103. Moreover, no voltage (or current) is applied to the dummy mesa stripes 171A and 171D, and hence the dummy mesa stripes 171A and 171D are not driven. Then, when the two mesa stripes 103A and 103D at both ends of the plurality of mesa stripes 103 to be actually driven have the center-to-center distance W of 150 μm or less, it is possible to reduce an effect of the above-mentioned structure on the SMSR yield.

In the semiconductor laser device 100, the plurality of mesa stripes 103 are arranged side by side, and the high-resistance InP layer 117 is buried on both sides of each of the plurality of mesa stripes 103. On both sides of each of the two mesa stripes 103B and 103C of the plurality of mesa stripes 103, the mesa stripes 103 are arranged adjacent to the two mesa stripes 103B and 103C with substantially the same center-to-center distance, and the high-resistance InP layer 117 is buried between the two mesa stripes 103B and 103C and the adjacent mesa stripes. Meanwhile, as for the mesa stripe 103A (103D) at one of the both ends, the mesa stripe 103B (103C) is adjacently provided on the right side (left side) of the mesa stripe 103A (103D) as viewed from the beam exit direction of the mesa stripe 103A (103D) itself, and the high-resistance InP layer 117 is buried between the mesa stripe 103A (103D) and the adjacent mesa stripe 103B (103C), but no adjacent mesa stripe 103 is provided on the left side (right side) of the mesa stripe 103A (103D) as viewed from the beam exit direction, and the high-resistance InP layer 117 is buried in a large region on the left side (right side) of the mesa stripe 103A (103D). That is, the surroundings of the two mesa stripes 103A and 103D at both ends are asymmetrical with respect to the extending direction thereof, and hence the mesa stripes 103A and 103D are highly liable to receive asymmetrical stress. Such asymmetrical stress is undesirable in view of device characteristics and also in view of device reliability.

In contrast, in the semiconductor laser device 170, through the provision of at least one dummy mesa stripe 171 outside of each of the two mesa stripes 103A and 103D at both ends, it is possible to suppress asymmetry in stress applied to the two mesa stripes 103A and 103D at both ends. The two dummy mesa stripes 171A (171D) are arranged on the left side (right side) of the two mesa stripes 103A and 103D as viewed from the beam exit direction of the mesa stripe 103A (103D), with which the asymmetry in stress applied to the mesa stripe 103A (103D) is further suppressed.

The semiconductor laser device 170 includes the two dummy mesa stripes arranged outside of each of the two mesa stripes 103 at both ends, but the present disclosure is not limited thereto. It is desired to provide the two dummy mesa stripes in view of the symmetry, but one dummy mesa stripe may be provided instead. It is further desired to provide three or more dummy mesa stripes in view of the symmetry.

The semiconductor laser device 170 has the structure in which the dummy mesa stripes 171 are additionally arranged outside the plurality of mesa stripes 103 arranged in the semiconductor laser device 100, but the present disclosure is not limited thereto, and this structure is applicable to all the semiconductor laser devices in other implementations.

A semiconductor laser device 175 includes, in addition to the components of the semiconductor laser device 150, a plurality of optical amplifiers arranged between the plurality of mesa stripes 103 and the plurality of waveguides 105. However, the other structure of the semiconductor laser device 175 is the same as that of other implementations.

Figure 10:
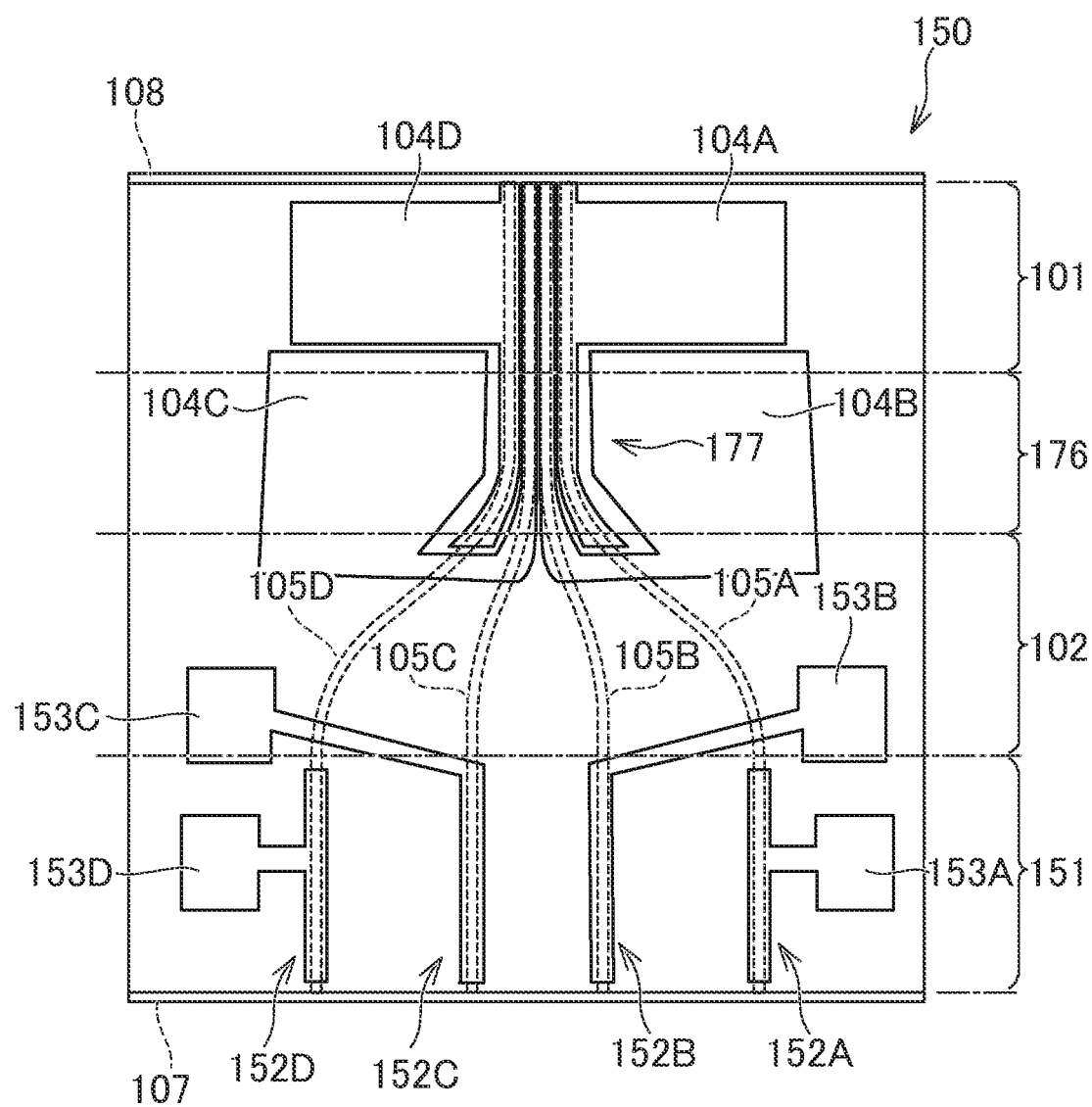
FIG. 10 is a plan view for illustrating a semiconductor laser device according to an example.

FIG. 10 is a plan view for illustrating the semiconductor laser device 175. As illustrated in FIG. 10, the semiconductor laser device 175 includes, in addition to the laser region 101, the waveguide region 102, and the modulation region 151, an optical amplification region 176 provided between the laser region 101 and the waveguide region 102. A plurality of optical amplifiers 177 are arranged in the optical amplification region 176.

The optical amplifiers 177 have the same structure as that of the mesa stripes 103 in the laser region 101 except that the diffraction grating layer 114 is not formed in mesa stripes included in the optical amplifiers 177. That is, the laser region 101 and the optical amplification region 176 are formed at the same time through a common manufacturing process. Further, at the time of driving the device, the same electric signal is applied to both of the active layer 112 in the laser region 101 and the active layer 112 in the optical amplification region 176, and hence it is only required to form electrodes common to both the regions. In FIG. 10, the electrodes are illustrated as the p-side electrodes 104A, 104B, 104C, and 104D as in other implementations.

In the semiconductor laser device 175, the optical amplifiers 177 are arranged, with which the optical semiconductor device enables high output. In particular, the semiconductor laser device 175 includes the modulators 152, and the mesa stripes 103 in the laser region 101 continuously oscillate, and hence with the structure in which the optical amplifiers 177 are used in a gain saturation region, more stable optical outputs are input to the modulators 152.

The mesa stripes 103 in the laser region 101 have the diffraction grating, but the mesa stripes in the optical amplification region 176 have no diffraction grating, and hence the degree of freedom in shape of the mesa stripe is further increased. In the semiconductor laser device 175, the four mesa stripes 103 arranged in the laser region 101 linearly extend, whereas the four mesa stripes arranged in the optical amplification region 176 extend outward on both sides at their front portions. In accordance with such a shape, the p-side electrodes 104 have a different shape in their front portions (end portions on the waveguide region 102 side) from the p-side electrodes 104 in other implementations.

The semiconductor laser device 175 includes the optical amplifiers 177 arranged in the semiconductor laser device 150 in other implementations, and a significant effect is produced by amplifying optical outputs obtained through continuous oscillation, but the present disclosure is not limited to the above-mentioned structure. This structure is applicable to all the semiconductor laser devices in other implementations.

In the semiconductor laser device 175, the active layer 112 of the mesa stripes 103 arranged in the laser region 101 and the waveguide layer 120 of the mesa stripes 106 arranged in the waveguide region 102 are optically connected via the active layer 112 of the mesa stripes arranged in the optical amplification region 176. Here, the active layer 112 of the mesa stripes arranged in the optical amplification region 176 and the waveguide layer 120 of the mesa stripes 106 arranged in the waveguide region 102 are butt-joined. As described above, the active layer 112 of the mesa stripes 103 arranged in the laser region 101 and the waveguide layer 120 of the mesa stripe 106 arranged in the waveguide region 102 may be directly connected through butt-joining as in other implementations, or may be connected via other mesa stripes. In this way, it is only required to optically connect the active layer and the waveguide layer.

The optical semiconductor device, the optical sub-assembly, and the optical module according to the some implementations have been described so far. The present disclosure is not limited to such, and is widely applicable to optical semiconductor devices, optical sub-assemblies, and optical modules, in which a plurality of mesa stripes each including an active layer and a diffraction grating are arranged side by side on a semiconductor substrate, and a reflective film is formed on a back end surface.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An optical semiconductor device comprising:
    a semiconductor substrate;
    a plurality of mesa stripes, which are arranged side by side on the semiconductor substrate, and each of which includes an active layer and a diffraction grating, the diffraction grating extending up to a back end surface of each of the plurality of mesa stripes;
    a plurality of electrodes, each of which is electrically connected to an upper surface of a corresponding one of the plurality of mesa stripes, having a pad portion for wire bonding;
    a plurality of waveguides, each of which is optically connected to the active layer of a corresponding one of the plurality of mesa stripes, and that fan out from the plurality of mesa stripes,
        wherein a first electrode of the plurality of electrodes connected to one or more first mesa stripes, of the plurality of mesa stripes, crosses one or more of the plurality of waveguides,
        wherein the first electrode wraps around a tip of a second electrode, of the plurality of electrodes, on at least three sides, and includes a diagonal cut along a direction of the plurality of waveguides that fan out,
        wherein the diagonal cut is configured to avoid overlap with the plurality of waveguides,
        wherein the second electrode is connected to a second mesa stripe of the plurality of mesa stripes,
        wherein the tip of the second electrode extends outward in a direction parallel to the waveguide, and
    wherein the one or more first mesa stripes are configured to be between one or more second mesa stripes, of the plurality of mesa stripes; and
    a reflective film provided at back end surfaces of the plurality of mesa stripes and having a reflectivity of 30% or more,
        wherein a center-to-center distance at back end surfaces of two mesa stripes at both ends of the plurality of mesa stripes is 150 µm or less, and
        wherein at least two mesa stripes, of the plurality of mesa stripes, are configured to be driven at the same time.

2. The optical semiconductor device of claim 1, further comprising:
    an array device in which a plurality of distributed feedback lasers are integrated, the plurality of distributed feedback lasers each including a corresponding one of the plurality of mesa stripes.

3. The optical semiconductor device of claim 2, wherein output beams emitted from the plurality of distributed feedback lasers have a wavelength in a 1.3-μm band.

4. The optical semiconductor device of claim 1, further comprising:
a plurality of modulators, each of which is provided in front of a corresponding one of the plurality of waveguides.

5. The optical semiconductor device of claim 1, further comprising:
a plurality of optical amplifiers, each of which is provided between a corresponding one of the plurality of mesa stripes and a corresponding one of the plurality of waveguides.

6. The optical semiconductor device of claim 1, further comprising:
a dummy mesa stripe provided outside of each of the two mesa stripes at both ends of the plurality of mesa stripes.

7. The optical semiconductor device of claim 1, wherein at least one waveguide, of the plurality of waveguides, has a bent portion with respect to an extending direction of a corresponding one of the plurality of mesa stripes.

8. The optical semiconductor device of claim 1, wherein at least one adjacent pair of waveguides, of the plurality of waveguides, has portions that extend outward as viewed from a beam exit direction compared with an adjacent pair of mesa stripes corresponding to the at least one adjacent pair of waveguides.

9. The optical semiconductor device of claim 8, wherein the at least one adjacent pair of waveguides has a longer center-to-center distance at front end surfaces of the at least one adjacent pair of waveguides than at back end surfaces thereof.

10. An optical sub-assembly, comprising:
the optical semiconductor device of claim 1;
a plurality of wires wire-bonded to the plurality of electrodes; and
a driver configured to output an electric signal for driving the optical semiconductor device.

11. The optical sub-assembly of claim 10, wherein at least one waveguide, of the plurality of waveguides, has a bent portion with respect to an extending direction of a corresponding one of the plurality of mesa stripes.

12. The optical sub-assembly of claim 10, wherein at least one adjacent pair of waveguides, of the plurality of waveguides, has portions that extend outward, as viewed from a beam exit direction, compared with an adjacent pair of mesa stripes corresponding to the at least one adjacent pair of waveguides.

13. An optical module, comprising an optical sub-assembly, wherein the optical sub-assembly comprises:
the optical semiconductor device of claim 1;
a plurality of wires wire-bonded to the plurality of electrodes; and
a driver configured to output an electric signal for driving the optical semiconductor device.

14. The optical module of claim 13, wherein at least one adjacent pair of waveguides, of the plurality of waveguides, has portions that extend outward, as viewed from a beam exit direction, compared with an adjacent pair of mesa stripes corresponding to the at least one adjacent pair of waveguides.

15. The optical semiconductor device of claim 1, wherein a first portion of the first electrode wraps around the second electrode, and
wherein the first portion of the first electrode overlaps a portion of the one or more waveguides.

16. The optical semiconductor device of claim 1, wherein the first electrode is configured to avoid overlap with the second electrode.

17. The optical semiconductor device of claim 1, wherein the diagonal cut is configured to be on a corner of the first electrode.

18. The optical semiconductor device of claim 1, wherein the first electrode and the second electrode are configured to be adjacent each other along the direction of the plurality of waveguides.

19. The optical semiconductor device of claim 1, wherein the tip of the second electrode overlaps a waveguide of the plurality of waveguides.

20. The optical semiconductor device of claim 1, wherein the diagonal cut is configured to be on a corner of the first electrode that is different from another corner that is adjacent to the tip of the second electrode.

* * * * *